(12) United States Patent
Tarnow et al.

(10) Patent No.: US 9,554,632 B2
(45) Date of Patent: Jan. 31, 2017

(54) PORTABLE DEVICE CASE AND ACCESSORIES

(71) Applicant: Logitech Europe S.A., Lausanne (CH)

(72) Inventors: Derek Tarnow, Chicago, IL (US); Ariel Fischer, San Francisco, CA (US); Vivekanand Jayaraman, San Ramon, CA (US); Scot Herbst, Santa Cruz, CA (US)

(73) Assignee: Logitech Europe S.A., Lausanne (CH)

( * ) Notice: Subject to any disclaimer, the term of this patent is extended or adjusted under 35 U.S.C. 154(b) by 108 days.

(21) Appl. No.: 14/312,096

(22) Filed: Jun. 23, 2014

(65) Prior Publication Data

US 2014/0375186 A1    Dec. 25, 2014

Related U.S. Application Data

(60) Provisional application No. 61/837,979, filed on Jun. 21, 2013.

(51) Int. Cl.

| | | |
|---|---|---|
| *A45C 13/02* | (2006.01) | |
| *A45C 11/00* | (2006.01) | |
| *G06F 1/18* | (2006.01) | |
| *H05K 5/03* | (2006.01) | |
| *H05K 5/02* | (2006.01) | |
| *H04M 1/02* | (2006.01) | |
| *H04M 1/04* | (2006.01) | |
| *F16M 11/06* | (2006.01) | |
| *F16M 13/02* | (2006.01) | |
| *F16M 11/04* | (2006.01) | |
| *F16M 11/10* | (2006.01) | |

(Continued)

(52) U.S. Cl.
CPC ............. *A45C 11/00* (2013.01); *F16M 11/041* (2013.01); *F16M 11/06* (2013.01); *F16M 11/10* (2013.01); *F16M 11/105* (2013.01); *F16M 11/22* (2013.01); *F16M 13/00* (2013.01); *F16M 13/022* (2013.01); *G06F 1/189* (2013.01); *H04M 1/0202* (2013.01); *H04M 1/04* (2013.01); *H05K 5/0217* (2013.01); *A45C 2011/002* (2013.01); *A45C 2011/003* (2013.01)

(58) Field of Classification Search
CPC ....... A45C 11/00; F16M 11/041; F16M 11/06; F16M 11/10; F16M 11/105; F16M 11/22; F16M 13/022; H04M 1/0202; H04M 1/04; H05K 5/0217; G06F 1/189
USPC ....... 206/320, 818; 455/575.1, 575.8, 575.9; 361/679.26, 679.3; 224/930
See application file for complete search history.

(56) References Cited

U.S. PATENT DOCUMENTS 8,939,482 B2 *   1/2015   Rasmussen ............... A45F 5/00
                                                                          224/218
9,131,756 B2 *   9/2015   Hurst ................. A45C 13/1069
(Continued)

*Primary Examiner* — Chun Cheung
(74) *Attorney, Agent, or Firm* — Kilpatrick Townsend & Stockton LLP

(57) ABSTRACT

Cases for portable electronic devices are described including multiple alignment elements (e.g. slugs, magnets or physical securing means) embedded in a panel, such as the back panel of the case. Various accessories, such as stands, cord spools, mounts, communication devices, speakers, displays, etc., may also have multiple corresponding alignment elements (e.g. magnets, slugs or cooperative physical securing means) in them that allow the accessories to be semi-securely attached to the case in a plurality of specific positions and/or orientations.

20 Claims, 11 Drawing Sheets

(51) Int. Cl.
*F16M 11/22* (2006.01)
*F16M 13/00* (2006.01)

(56) References Cited

U.S. PATENT DOCUMENTS

| | | | | |
|---|---|---|---|---|
| 2008/0023508 A1* | 1/2008 | Harchol | ............... | A45F 5/02 |
| | | | | 224/183 |
| 2012/0274195 A1* | 11/2012 | Thompson | ......... | H04M 1/0283 |
| | | | | 312/237 |
| 2013/0098788 A1* | 4/2013 | McCarville | ........... | A45C 11/00 |
| | | | | 206/320 |
| 2015/0105127 A1* | 4/2015 | Thompson | ............ | G06F 1/1628 |
| | | | | 455/575.8 |

* cited by examiner

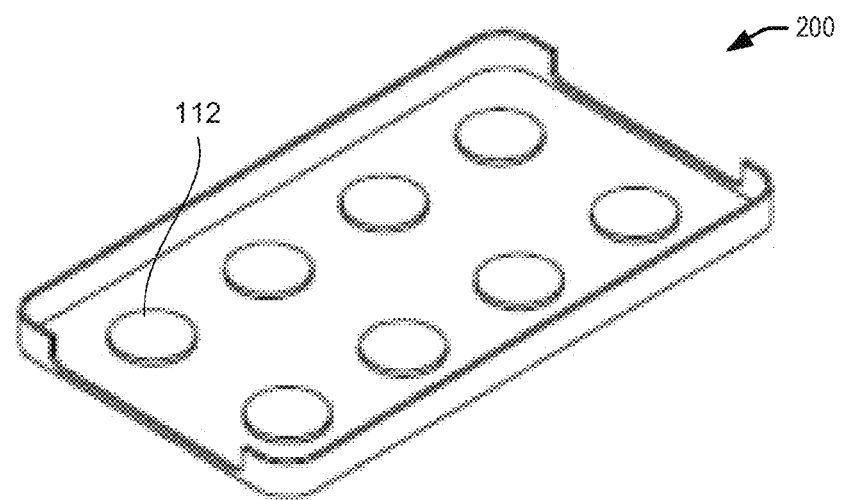
FIG. 2
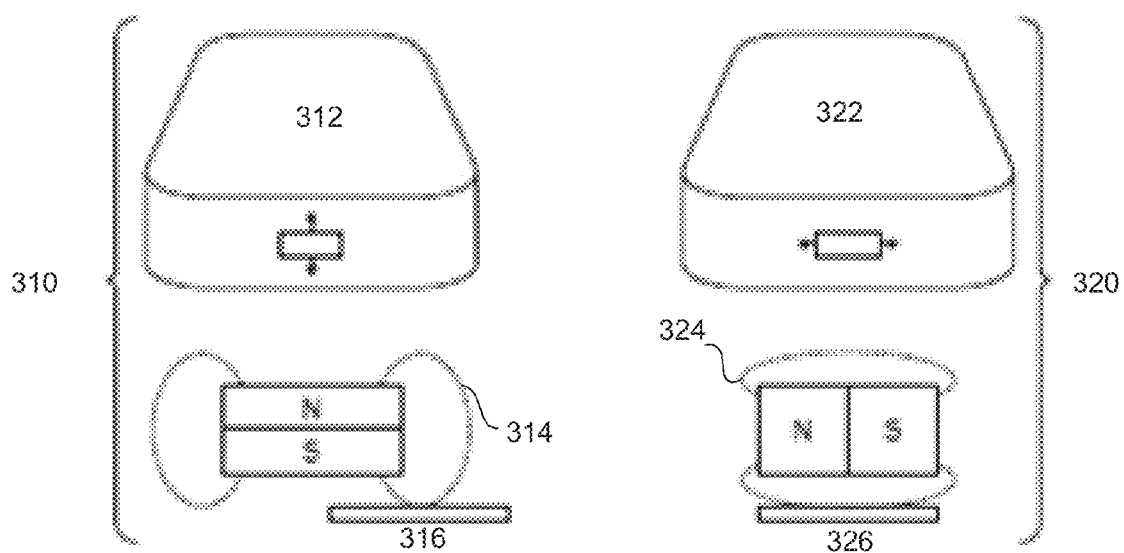
FIG. 3A  FIG. 3B

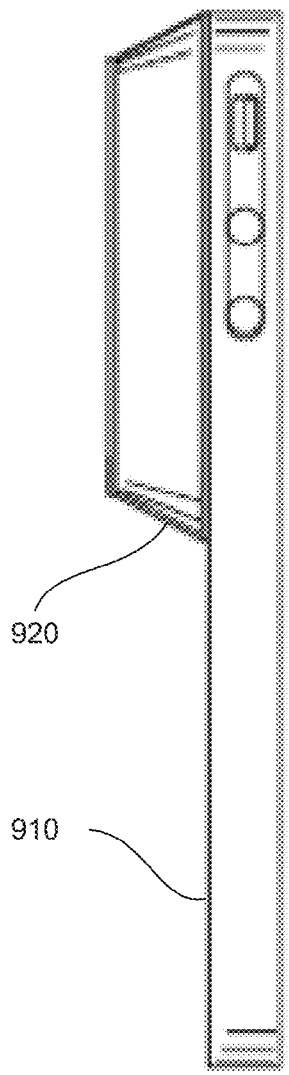 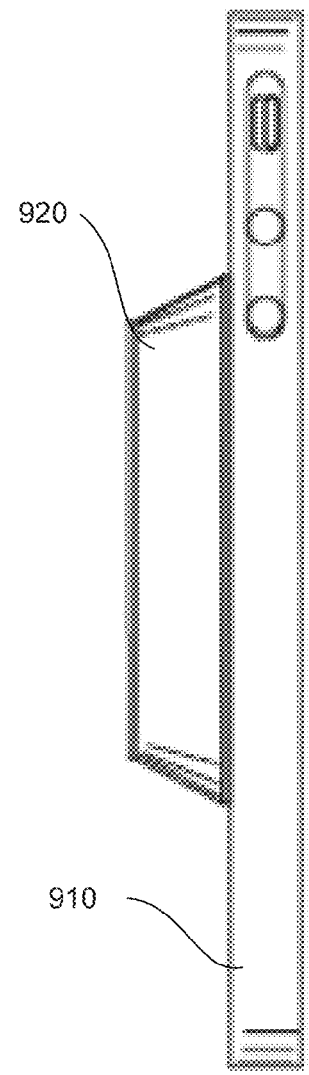
FIG. 9A　　　　FIG. 9B

PORTABLE DEVICE CASE AND ACCESSORIES

BACKGROUND OF THE INVENTION

The present subject matter relates to cases and accessories for portable devices, such as personal media players, smartphones, tablet computers, and other electronic devices. As portable devices have become increasingly more functional with increasing computing power, graphics and communications capabilities and decreasing size, there have been ongoing needs to make the devices themselves more user accessible, convenient and easy to use. Various accessories have been provided to address aspects of these and other limitations of mobile devices, such as ruggedized cases, speakers, chargers, etc.

Despite the successes that have been achieved using certain accessories for certain purposes, there are still limitations in the range of solutions that individual accessories can provide. Most (perhaps all) users do not make use of the full range of capabilities that their portable devices can provide. In many cases, the user could benefit from making it easier and/or more secure to use their portable device in many different situations, e.g. by providing stands, holders and the like at various locations that support different orientations and device capabilities. In addition, there is an ongoing consumer need for accessories that improve upon the accessibility of portable devices and help to expand their usefulness in various parts of users' day to day lives.

SUMMARY OF THE INVENTION

Aspects of the present invention may provide a case for a portable device, such as a personal media player, smartphone or tablet computer, with multiple alignment elements (e.g. slugs, magnets or physical securing means) embedded in a panel, such as the back panel of the case. The case may be integral with, or removable from the portable device. Various accessories, such as stands, cord spools, mounts, etc., may also have multiple corresponding alignment elements (e.g. magnets, slugs or cooperative physical securing means) in them that allow the accessories to be semi-securely attached to the case in a plurality of specific positions and/or orientations.

Embodiments may include means for joining the portable device to various accessories, such as, for example, magnets, surface contours, locking mechanisms, and the like.

In embodiments, a surface of the device case may include a symmetrical 3-dimensional pattern, hole patterns, perforations and/or the like. Accessories may include corresponding 3-dimensional pattern(s) that help to orient the case/device with respect to the accessory.

In embodiments, accessories may include one or more of, a full size battery, a reduced size battery, a stand, a suction mount, a magnetic mount, a car mount, a folding mount, a swivel mount, a triangular mount, a multi-purpose mount, a spool, a speaker, a display, a charging station, a docking station, a communication device such as a modem, a network hub, a repeater or blaster, a wallet, a fashion plate accessory, a stylus, an input device, a physical interaction device (e.g. a touchpad or haptic feedback device), etc. Embodiments may include kits with a case and one or more of the foregoing, or other, accessories.

In embodiments, the accessory may have a length and width that substantially correspond to a length and width of the case for the device. In other embodiments, the accessory may have a length and width that is less than a length and width of the case for the device. In other embodiments, the accessory may have a length and/or width that is ½, ¼, or other ratio related to the number of magnets and/or slugs included in the case and accessory, compared to a length and/or width of the case for the device.

In embodiments, the case and/or accessory may include various sub-units, such as a power unit, a control unit, and/or a communication module. Communication modules may be configured to receive audio data and/or signals and to provide the audio data to a speaker, and may include, for example, wireless receivers, USB ports, audio jacks, etc.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention claimed. The detailed description and the specific examples, however, indicate only preferred embodiments of the invention. Various changes and modifications within the spirit and scope of the invention will become apparent to those skilled in the art from this detailed description.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and various ways in which it may be practiced. In the drawings:

FIG. 2 depicts a case including a plurality of arrangement elements according to exemplary embodiments of the invention.

FIGS. 3A and 3B depict alternative configurations of magnetic arrangement elements according to exemplary embodiments of the invention.

FIGS. 9A and 9B depict a case and another reduced-footprint accessory according to exemplary embodiments of the invention.

DETAILED DESCRIPTION OF THE INVENTION

Figure 1:
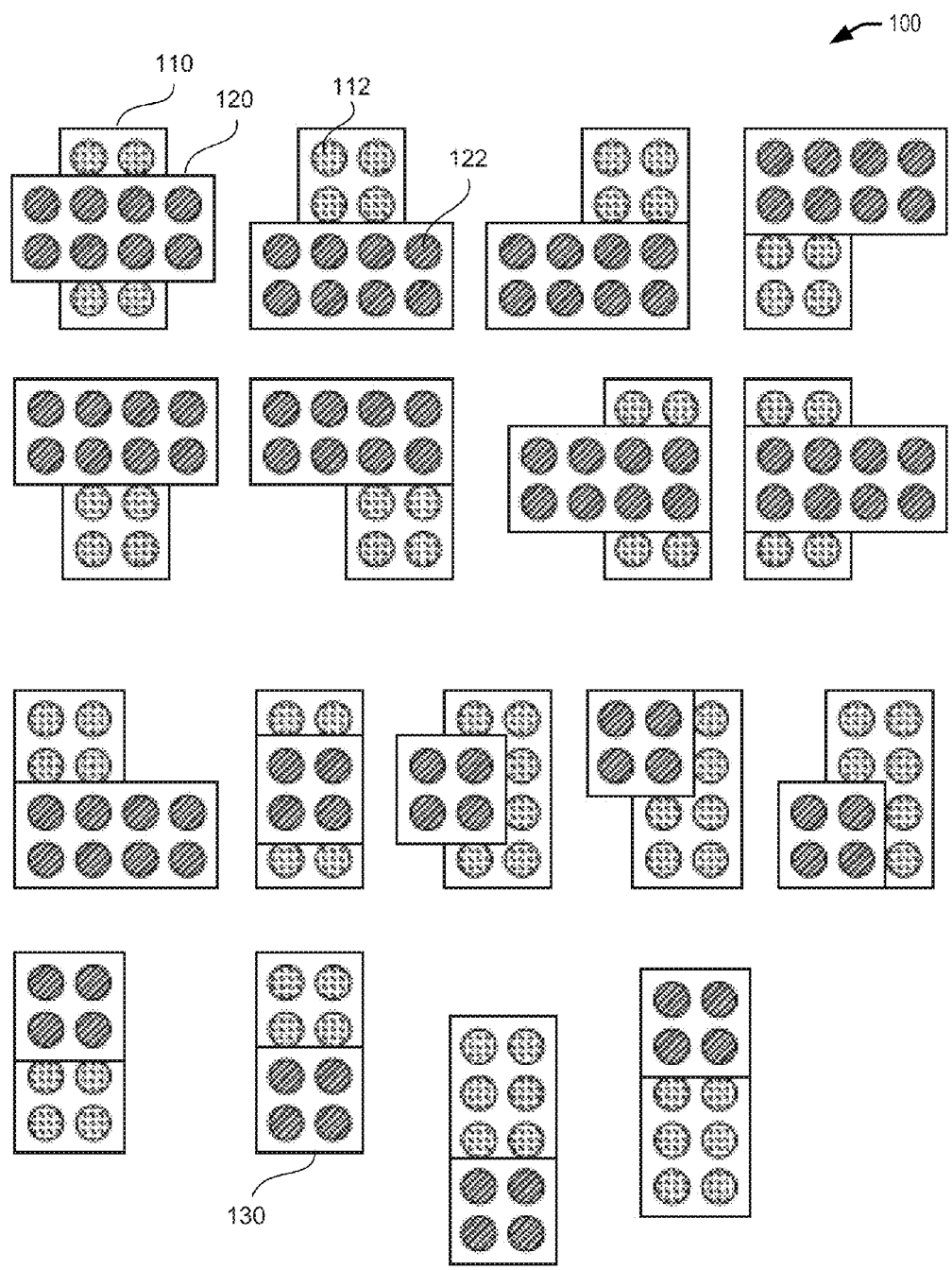
FIG. 1 depicts a plurality of case and accessory arrangements according to exemplary embodiments of the invention.

It is understood that the invention is not limited to the particular methodology, protocols, etc., described herein, as these may vary as the skilled artisan will recognize. It is also to be understood that the terminology used herein is used for the purpose of describing particular embodiments only, and is not intended to limit the scope of the invention. It also is to be noted that as used herein and in the appended claims, the singular forms "a," "an," and "the" include the plural reference unless the context clearly dictates otherwise. Thus, for example, a reference to "a flap" is a reference to one or more flaps and equivalents thereof known to those skilled in the art.

Unless defined otherwise, all technical terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings.

FIG. 1 is a schematic view showing a plurality of arrangement elements on cases and accessories according to first aspects of the invention. As shown in FIG. 1, the case and/or accessory may include "domino" like arrangements of, for example, slugs and/or magnets, e.g. in 8 or 4 part arrangements. Accordingly, the case may be joined to the accessory in a variety of ways that fully cover, or partially cover, the accessory. In embodiments, the case surface may be substantially the same size as the accessory surface, or the case surface may be larger than the accessory surface, or vice versa.

In embodiments, the arrangement elements may be disposed in a domino or other pattern on each of the case and accessory, e.g. with 8 elements on the case, and an even number of elements on the accessory, such as 2, 4, 8, 10, 12 or 16. Other embodiments may include arrangements of odd numbers of elements, such as when constrained by, or more appropriate for, the form factor of the accessory.

For example, as shown in FIG. 1, a case 110 may include a plurality of arrangement elements 112 (in this case magnets or slugs) that may be used to attach, at least temporarily, an accessory (120 or 130) with correspondingly arranged elements 122. Case 110 may be attached, at least temporarily, to a "full size" accessory 120 (i.e. an accessory that has a substantially similar surface area to that of the case) in a variety of ways including orienting the accessory 120 in different rotational positions, and engaging different elements 112 and 122. It should be further understood that the case 110 may be integral with, or removable from, a portable device.

Thus, as will be appreciated from FIG. 1, a case and accessory system for a portable electronic device may include a device case including a backing with a plurality of slugs or magnets embedded preferably symmetrically therein; an accessory including a surface with a plurality of slugs or magnets embedded therein and disposed in a complimentary pattern to the plurality of slugs or magnets embedded in the case, wherein the patterns of the slugs and/or magnets are configured to allow the case to be semi-securely mounted to the accessory in a plurality of positions and/or orientations, at least two of the plurality of positions and/or orientations including an arrangement in which the case completely overlays the accessory, and another arrangement in which the case only partially overlays the accessory.

In embodiments, an accessory, like accessory 120, may have a length and width that substantially correspond to a length and width of the case 110. In other embodiments, the accessory, like accessory 130, may have a length and width that is less (or greater) than a length and width of the case for the device. Preferably, the accessory may have a length and/or width that is ½, ¼, or other ratio related to the number of magnets and/or slugs included in the case and accessory, compared to a length and/or width of the case for the device. However, other dimensions and arrangements are also possible, and the accessory (or accessory mounting surface) may have a shape that is different than that of the case, e.g. circular, oval, triangular, etc.

As discussed further below, accessories may include one or more of, a full size battery, a reduced size battery, a stand, a suction mount, a magnetic mount, a car mount, a folding mount, a swivel mount, a triangular mount, a multi-purpose mount, a spool, a speaker, a display, a charging station, a docking station, a communication device such as a modem, a network hub, a repeater or blaster, a wallet, a fashion plate accessory, a stylus, an input device, a physical interaction device (e.g. a touchpad or haptic feedback device), etc.

FIG. 2 also shows an exemplary case (or case portion) 200 including a plurality of arrangement elements 112. In some examples, arrangement elements 112 may include magnets, slugs, or other securing means, such as clips, hinges, hook and loop fasteners, micro/nano-suction, etc. that may be suitable to detachably secure and/or position the case and accessory.

In FIG. 2, a domino grid pattern of arrangement elements is shown, and has been found by the inventors to be well suited to objects of the invention, and with manufacturing restrictions related to implementing the design into other products and phone types. However, it should be appreciated that other patterns are also envisioned, such as diamond-shaped, offset lines, triangular, curved, etc.

It is also noted that, although some exemplary magnets and slugs may be shown and described as circular or cylindrical, other shapes are also possible including square, rectangular, elliptical, triangular, and combinations of the above. For example, "bars" of rectangular slugs or magnets may be included along an edge of the case or accessory (e.g. to facilitate interaction with certain accessories), and other cylindrical slugs or magnets may be included toward the center of the surface (e.g. to further provide adjustable semi-secure placement).

The inventors have also found that, in some cases, the type and/or orientation of magnetic arrangement elements may affects detent feel. For example, specific magnet design and strengths can affect the "snappy" feel of the mount design. FIGS. 3A and 3B depict two specific designs that were tested.

As shown in example 310 in FIG. 3A, a case 312, including axially magnetized magnets with field 314, was tested in a prototype. In this case, the inventors found that the detent feel was somewhat compromised because the steel plate 316 does not have a resting state centered on the magnet.

The inventors also tested with a different magnet design, e.g. example 320 where the case 322 includes a disc magnet that is diametrically magnetized with field 324, as seen in FIG. 3B. The magnetic field 324 was found to provide an improved interaction with plate 326 for detent and strength.

For ease of description, FIG. 3A may be understood as showing an example of wherein magnets are arranged on the accessory or case to provide a magnetic field that is substantially perpendicular to the mounting surface, whereas FIG. 3B may be understood as showing an example of wherein magnets are arranged on the accessory or case to provide a magnetic field that is substantially horizontal to the mounting surface.

Figure 4:
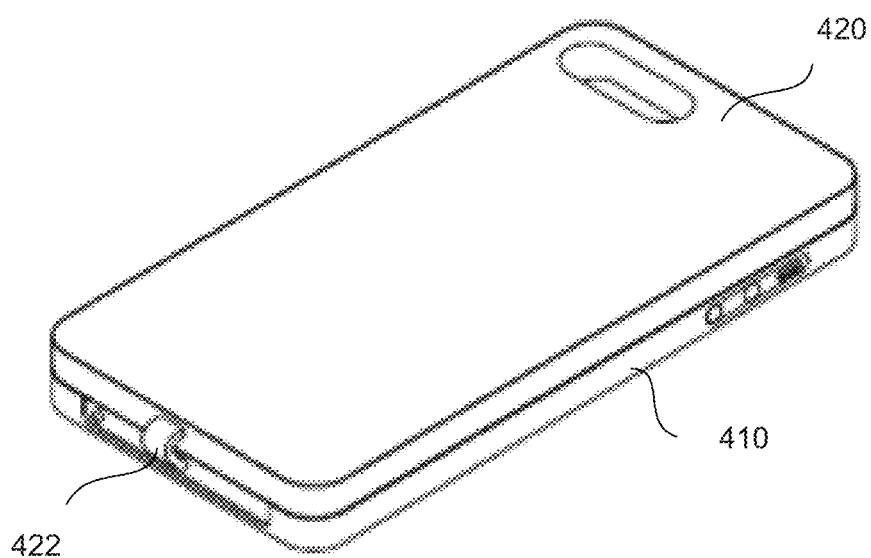
FIG. 4 depicts a case and a full-size accessory according to exemplary embodiments of the invention.

An example where the accessory is a full size battery is shown in FIG. 4, e.g. the battery 420 is substantially the same length and width as the case 410 (thickness may vary). In embodiments, battery 420, or other accessory described herein, may have additional magnets/slugs on the surface opposite the case (i.e. the full surface shown in FIG. 4), e.g. to allow the battery/accessory to mount to another accessory. As shown in FIG. 4, the battery 420 may include a power or communication plug 422 to communicate power and/or signals to the device included in case 410.

Other accessories may also be configured with a length and width that substantially correspond to a length and width of the case for the device, or that are larger than those of the case. For example, a screen may be configured to attach to the case 410 with a viewing surface opposite the mounting surface. In some examples, the screen may be larger than one included in the device and allow for improved viewing.

Figure 5:
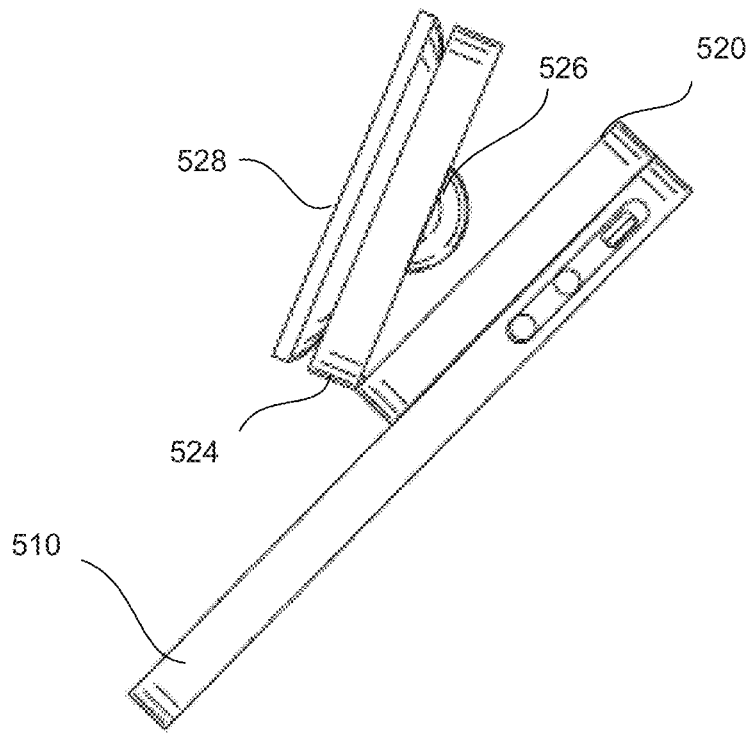
FIG. 5 depicts a case and reduced footprint mounting accessory according to exemplary embodiments of the invention.

In other embodiments, the accessory may have a length and/or width that is less than a length and/or width of the case for the device. For example, FIG. 5 shows a hinged stand 520, with a suction cup 528 attached to base 524. The stand 520 has a substantially square mounting surface with the magnets or slugs, that may be about the same width as the case 510. The case 510 may be longer than the surface of the stand 520, so it extends beyond the surface, as also shown. The stand 520 is configured to adhere to another mounting surface via suction cup 528 by pushing on the surface facing the case 510 (i.e. the surface including the magnets or slugs). Pressing on the surface of the stand 520 engages a contoured interior surface 526 of the accessory "lid" to an extension (shown as rounded), that communicates or otherwise provides pressure to suction cup 528 on the "base" of the stand 520. In embodiments, the base 524 may also be rotatable with respect to the suction cup 528, e.g. via a hinge or swivel.

In embodiments, the stand 520 may have a length and/or width that is ½, ¼, or other ratio related to the number of magnets and/or slugs included in the stand 520 and case 510, compared to a length and/or width of the case for the device.

Figure 6:
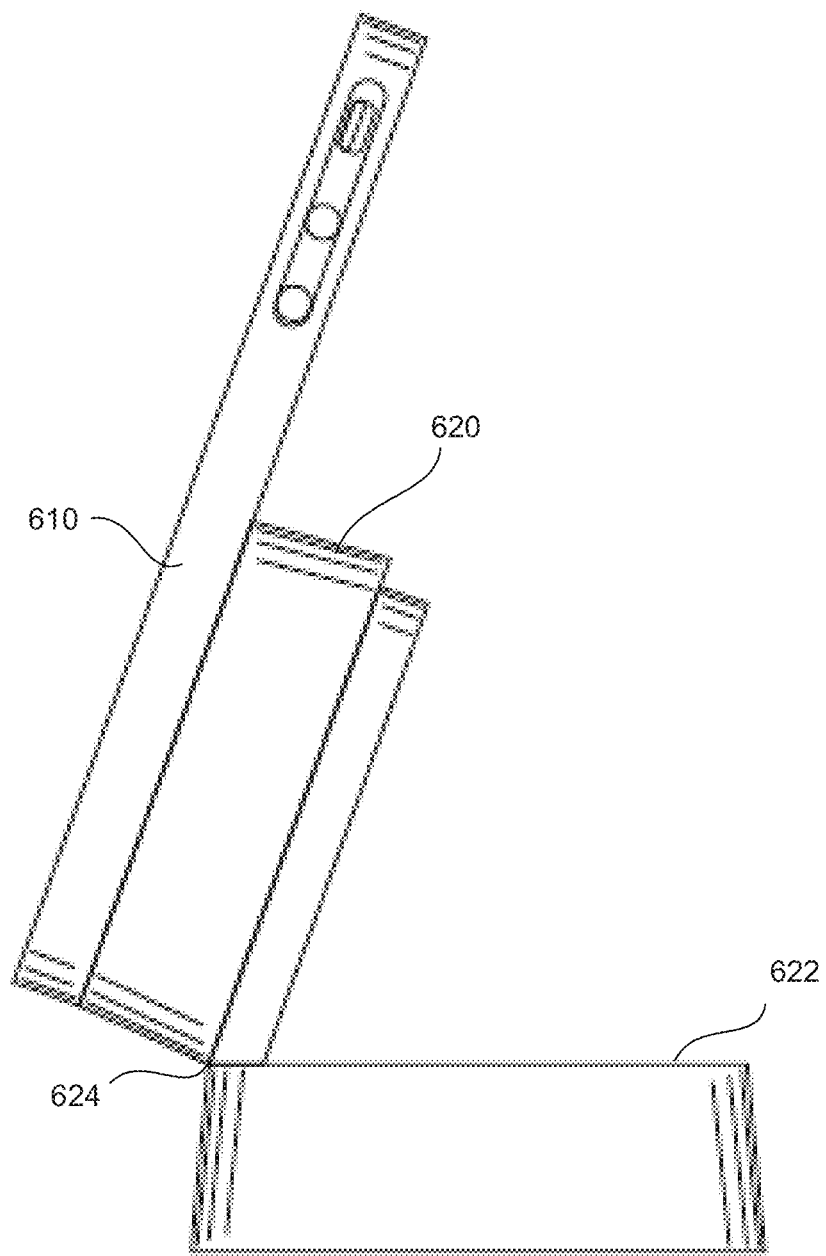
FIG. 6 depicts a case and another reduced footprint mounting accessory according to exemplary embodiments of the invention.

FIG. 6 shows another exemplary stand 620 with an attached case 610. Stand 620 may be, for example, configured as a stand for mounting base 622 in an automobile, or other surface. Although the embodiment shown in FIG. 6 includes a single axial hinge 624, other embodiments may be provided in which the accessory includes multiple hinges and/or swivels with parallel, and/or offset, axes. The embodiment shown in FIGS. 5 and 6 advantageously allow the device/case to be tilted to a desirable viewing angle, as also shown.

Figure 7:
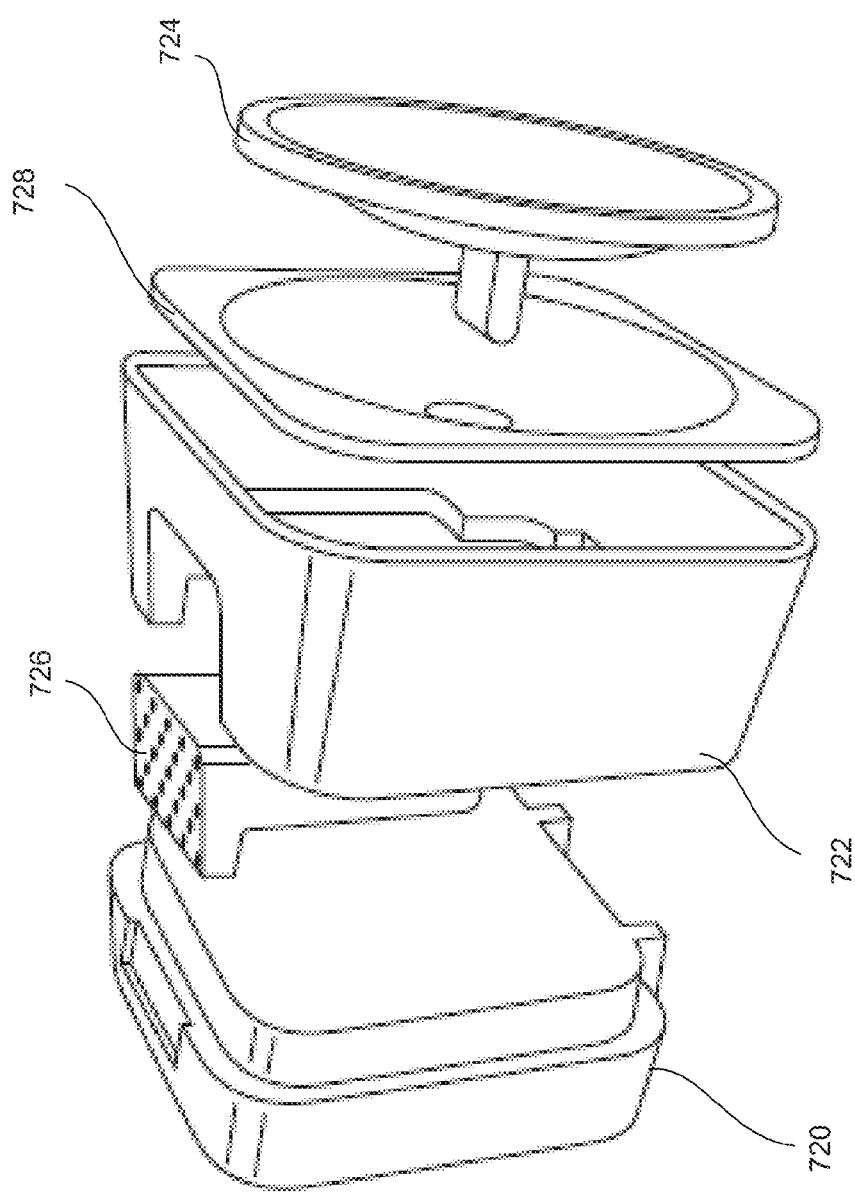
FIG. 7 depicts additional details of a mounting accessory, such as shown in FIG. 6, according to exemplary embodiments of the invention.

FIG. 7 shows additional details, including a cross sectional view, related to a stand 720 with a suction capability and release mechanism. In this embodiment, stand 720 includes a latch 726 that may be configured to, lock the stand 720 in a desirable viewing angle with respect to base 722, to release a locking hinge or otherwise allow rotation of the stand 720 with respect to the base 722, and/or to engage and disengage the suction cup 724. Suction cup 724 may be secured in element 728, which may include other attachment and/or arrangement means such as Velcro, detents, pins, etc. In some examples, batteries and/or other functional elements described herein may be included in stand 720.

In embodiments, the accessories, stands, etc. shown in FIGS. 4-7 may include communication modules configured to receive, transmit and/or exchange audio data, video data, and/or other signals and to provide, for example, audio/video data to a speaker, a display, or other device, and may include, for example, wireless receivers, USB ports, audio jacks, etc.

Figure 8B:
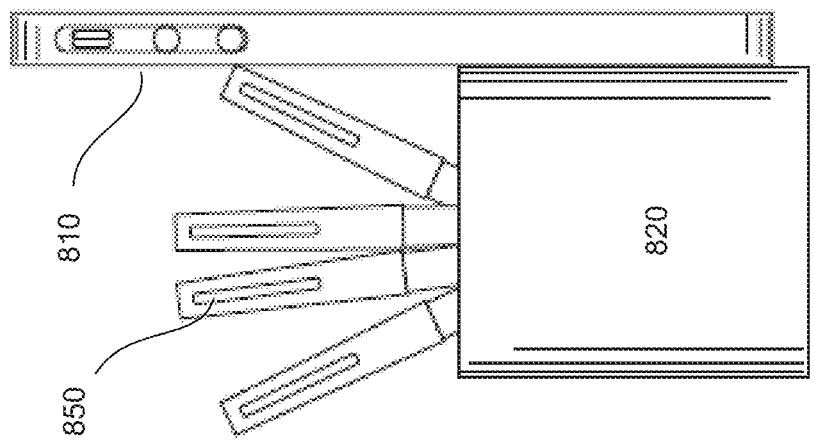
FIGS. 8A and 8B depict a case and another mounting accessory according to exemplary embodiments of the invention.
Figure 8A:
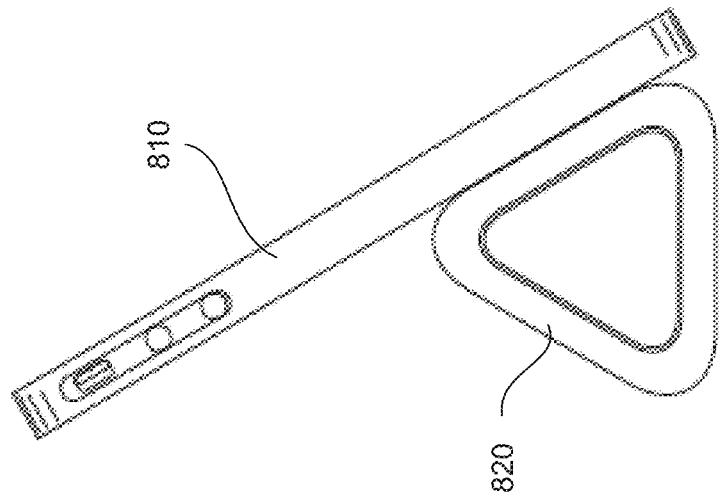

FIGS. 8A and 8B show an embodiment in which the accessory 820 is substantially triangular and is configured to hold the case 810 at one (or more) angles in one orientation (e.g. FIG. 8A), and to hold the case 810 vertically and to hold other items, such as pens 850, in a vertical cavity in another orientation (e.g. FIG. 8B). Magnets and/or slugs may be included in one or more of the sides of the triangular stand 820 as described herein. Although shown as a triangle with equal sides and angles, other examples may include triangles (or other shapes) with different side lengths and/or angles. Thus, a stand may be provided that allows for different viewing angles depending on which side is attached to the case 810. Other 3-dimensional shapes, without limitation, are also contemplated, with magnets and/or slugs arranged on different surfaces.

FIGS. 9A and 9B show an embodiment in which as reduced footprint accessory 920 may be mounted in a variety of positions on case 910. Accessory 920 may be, for example, a reduced size battery, with or without additional functionality embedded therein, and may include a retractable connection, such as element 422 shown in FIG. 4. Accessory 920 may include one or more sub-units incorporated therein, such as a display units, speaker units, power units, control units, communication modules, etc., and may be configured as, for example, a charging station, a docking station, a communication device such as a modem, a network hub, a repeater or blaster, an input device, a physical interaction device (e.g. a touchpad or haptic feedback device), a speaker, a game controller, etc.

Figure 10:
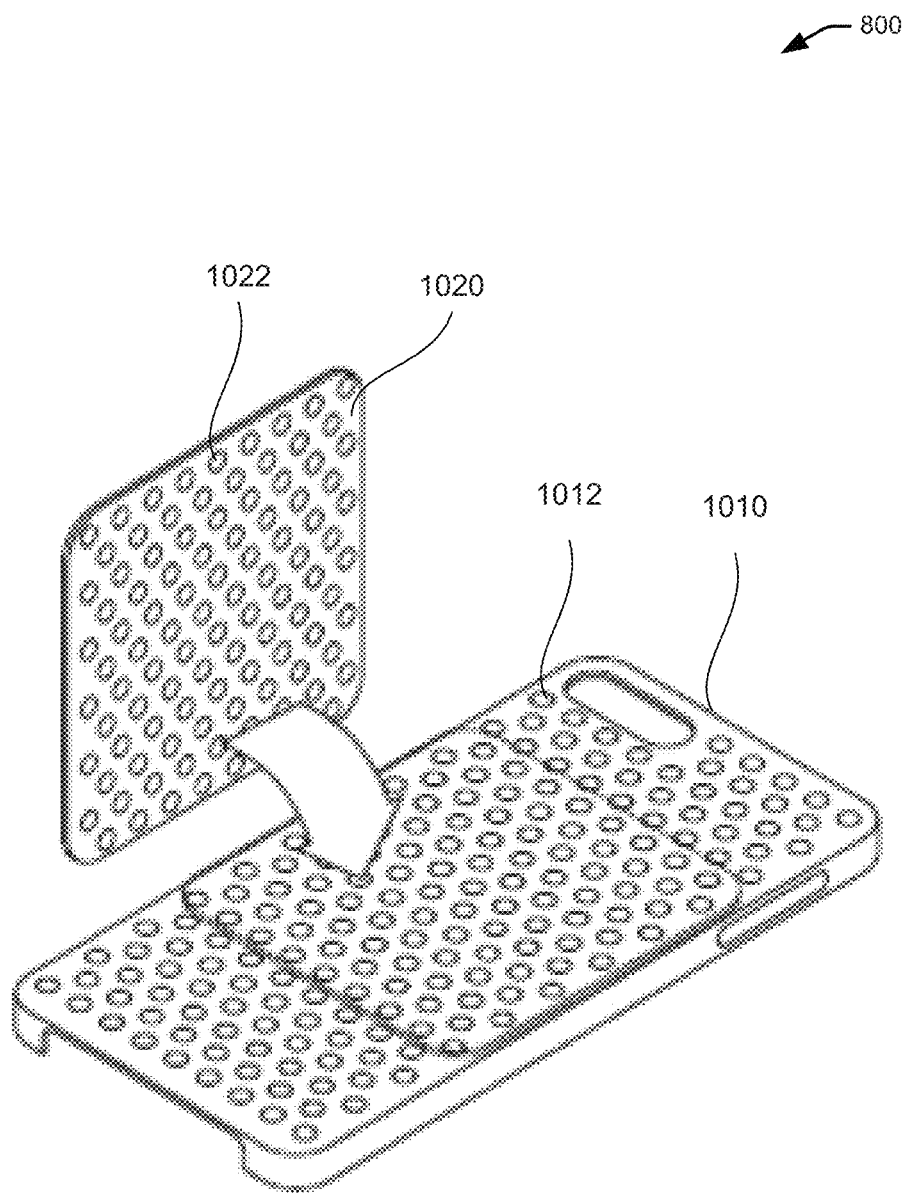
FIG. 10 depicts a case and an accessory with corresponding physical alignment features according to exemplary embodiments of the invention.

FIG. 10 shows an example of a case 1010 and accessory 1020 with a 3-dimensional surface pattern configured for aligning the case and the accessory in a plurality of positions. In the example shown in FIG. 10, the 3-dimensional pattern includes a plurality of holes 1022 and a plurality of plugs 1012 corresponding to matching holes. However, any surface pattern that allows the accessory to be aligned or positionally "registered" with the case may also be used, e.g. triangular, square, diamond or other surface relief patterns, etc.

Figure 11:
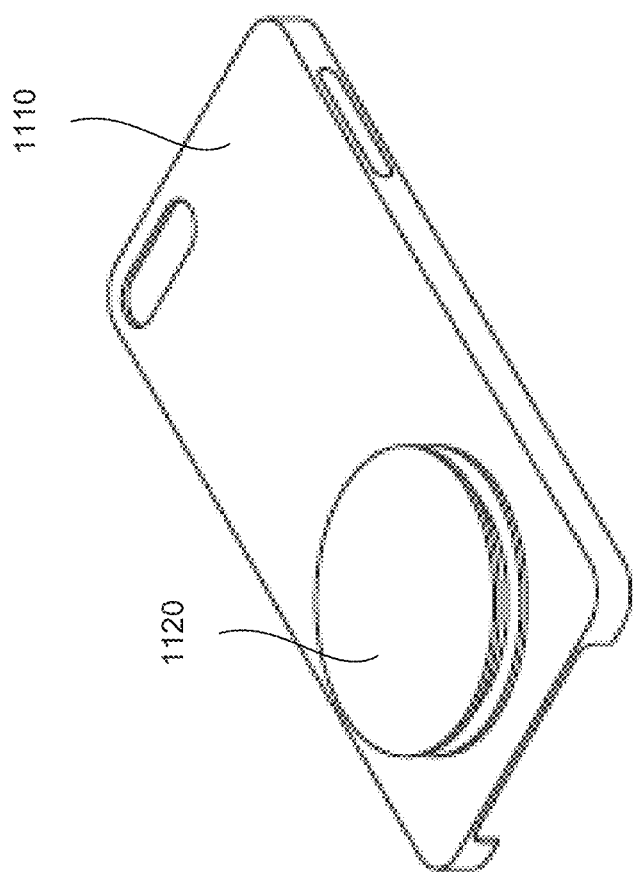
FIG. 11 depicts a case and another accessory according to exemplary embodiments of the invention.

FIG. 11 shows additional details of an embodiment in which the accessory 1120 is a spool. In some examples, spool 1120 may include a locking swivel, which may allow the spool to rotate or be rotationally fixed, e.g. to allow easy spooling and unspooling of headphone wires, etc. As will be understood, the spool 1120 may be mounted at various locations on the case, e.g. by aligning various attachment elements of the accessory 1120 and case 1110, as described herein.

Figure 12:
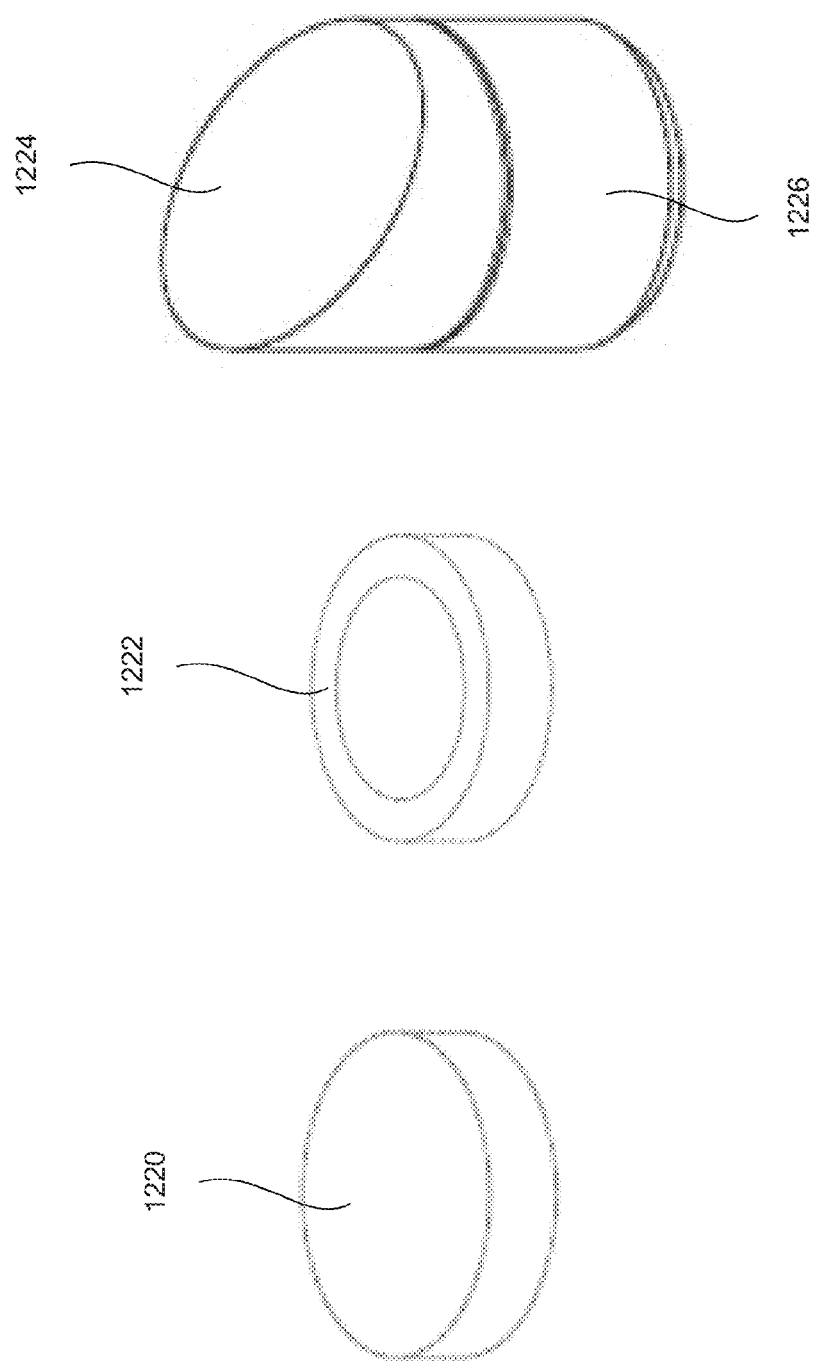
FIG. 12 depicts a plurality of mounting accessories according to exemplary embodiments of the invention.

FIG. 12 shows a plurality of accessories 1220, 1222, 1224 and 1226, which may be configured for independent use, and/or to cooperatively engage with one another, e.g. to provide additional functionality to a stand, provide additional power, to change stand height, etc. For example, angled stand 1224 may be configured with a mounting mechanism, such as a suction mount or cooperative engagement mechanism, and may rotate with respect to, one or more of elements 1220, 1222 and 1226. Element 1222 may include a suction mount, and element 1220 may include an alternative mounting mechanism, such as Velcro, latches, pins, etc. Any of stands 1220, 1222 and 1226 may include one or more sub-units incorporated therein, such as a speaker units, power units, control units, communication modules, etc., and may be configured as, for example, a charging station, a docking station, a communication device such as a modem, a network hub, a repeater or blaster, a speaker, etc.

Figure 13:
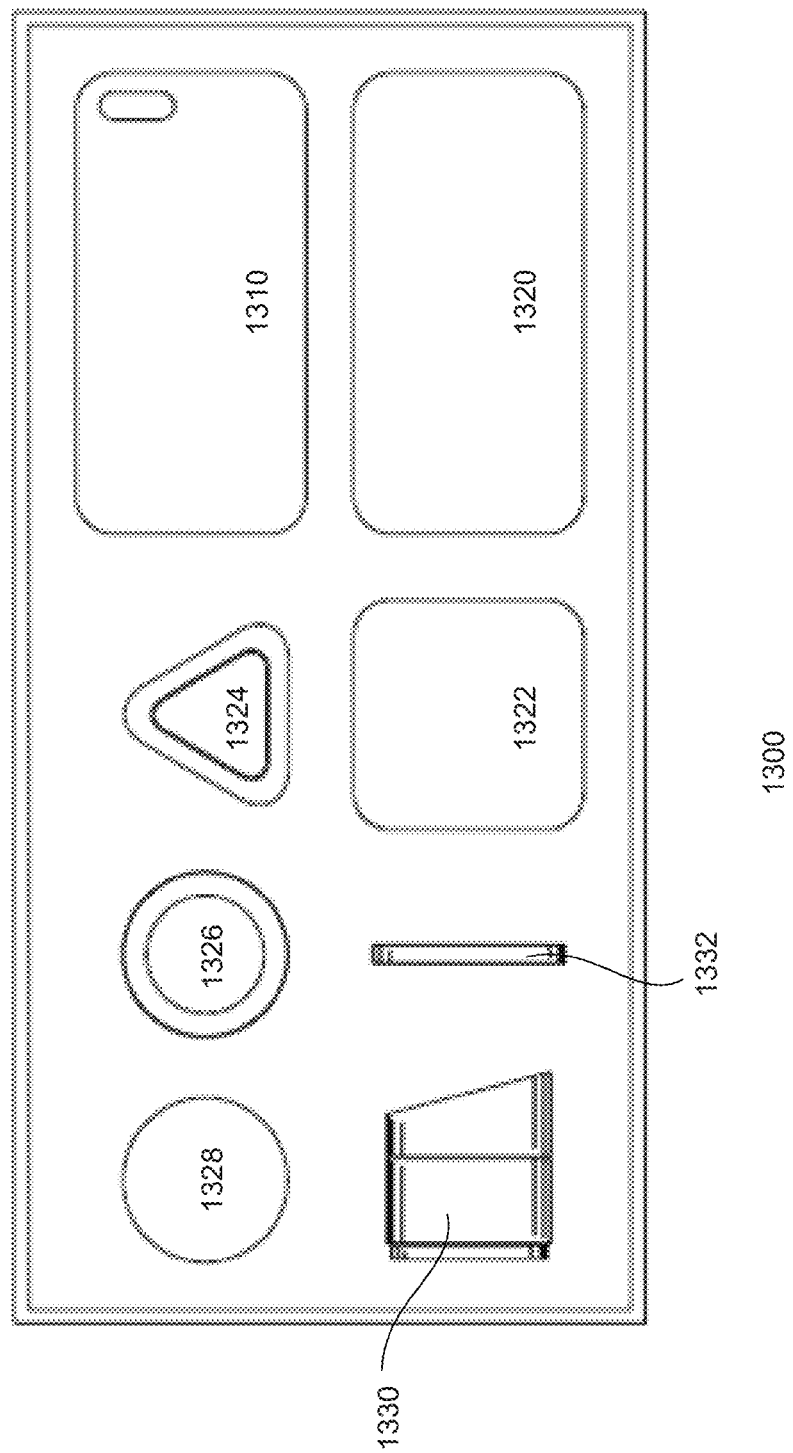
FIG. 13 depicts a kit including a case and a plurality of accessories according to exemplary embodiments of the invention.

FIG. 13 shows a kit 1300 including a case 1310 (which may include features described herein) and a variety of accessories such as a full size battery/accessory 1320, a reduced size battery/accessory 1322, a triangular surface stand 1324, a suction mount 1326, a wall mount 1328, a suction swivel 1330, and/or a spool 1332. Each of accessories 1320-1332 may include at least one surface that is configured to engage with alignment elements included in case 1310.

Other combinations and variations, including kits with one or more of the examples described herein, are also possible.

In some examples, case 1310 may include a backing and a plurality of slugs or magnets embedded preferably symmetrically therein. Each of accessories 1320-1332 may also include a surface with a plurality of slugs or magnets embedded therein and disposed in a complimentary pattern to the plurality of slugs or magnets embedded in the case 1310. The patterns of the slugs and/or magnets may be configured to allow the case 1310 to be semi-securely mounted to any of the accessories 1320-1332 in a plurality of positions and/or orientations, and at least two of the plurality of positions and/or orientations may include arrangements in which the case 1310 completely overlays the accessory with different parts of the case.

The description given above is merely illustrative and is not meant to be an exhaustive list of all possible embodiments, applications or modifications of the invention. Thus, various modifications and variations of the described methods and systems of the invention will be apparent to those skilled in the art without departing from the scope and spirit of the invention. Although the invention has been described in connection with specific embodiments, it should be understood that the invention as claimed should not be unduly limited to such specific embodiments.

What is claimed is:

1. A case and accessory system for a portable electronic device, said system comprising:
a device case including a backing with a first set of alignment elements embedded therein; and
an accessory including a surface with a second set of alignment elements embedded therein and disposed in a complimentary pattern to the first set of alignment elements,
wherein the patterns of the sets of alignment elements are configured to allow the case to be semi-securely mounted to the accessory in a plurality of positions and/or orientations, at least two of the plurality of positions and/or orientations including an arrangement in which the case completely overlays the accessory, and another arrangement in which the case only partially overlays the accessory, and
wherein the accessory further comprises a sub-unit including at least one of a power unit, a control unit, and a communication module.

2. The system of claim 1, wherein the first set of alignment elements are at least one of magnets and slugs, and the second set of alignment elements are at least one of magnets and slugs.

3. The system of claim 1, wherein case may be integral with, or removable from, the portable device.

4. The system of claim 1, wherein at least one of the case and the accessory further comprises a 3-dimensional surface pattern configured for aligning the case and the accessory in a plurality of positions.

5. The system of claim 4, wherein the 3-dimensional pattern includes a plurality of holes and/or a plurality of plugs corresponding to matching holes.

6. The system of claim 1, wherein the accessory includes one or more of a full size battery, a reduced size battery, a stand, a suction mount, a magnetic mount, a car mount, a folding mount, a swivel mount, a triangular mount, a multipurpose mount, a spool, a speaker, a display, a charging station, a docking station, a communication device, a network hub, a repeater or blaster.

7. The system of claim 1, further comprising at least two of the accessories, the at least two accessories providing different functionality to the device.

8. The system of claim 1, wherein the accessory has a length and width that substantially correspond to a length and width of the case for the device.

9. The system of claim 1, wherein the accessory has a length and width that is less than a length and width of the case for the device.

10. The system of claim 1, wherein the accessory has a length and/or width that is ½, ¼, or other ratio related to the number of magnets and/or slugs included in the case and accessory, compared to a length and/or width of the case for the device.

11. The system of claim 1, wherein the sets of alignment elements are arranged in a domino pattern on each of the case and accessory, with 8 alignment elements on the case, and an even number of alignment elements on the accessory.

12. The system of claim 1, wherein the alignment elements include at least one magnet that is arranged to provide a magnetic field that is substantially horizontal to the surface.

13. The system of claim 1, wherein the accessory includes a plurality of elements connected by at least one hinge and allows for an angle of the case to be adjusted.

14. A case and accessory system for a portable electronic device, said system comprising:
- a device case including a backing with a first set of alignment elements embedded therein; and
- an accessory including a surface with a second set of alignment elements embedded therein and disposed in a complimentary pattern to the first set of alignment elements,
- wherein the patterns of the sets of alignment elements are configured to allow the case to be semi-securely mounted to the accessory in a plurality of positions and/or orientations, at least two of the plurality of positions and/or orientations including an arrangement in which the case completely overlays the accessory, and another arrangement in which the case only partially overlays the accessory, and
- wherein the first set of alignment elements are arranged in a domino pattern.

15. The system of claim 14, wherein the sets of alignment elements are arranged in a domino pattern on each of the case and accessory.

16. The system of claim 14, wherein the accessory includes a plurality of elements connected by at least one hinge and allows for an angle of the case to be adjusted.

17. The system of claim 14, wherein the accessory is configured to adhere to a mounting surface by pushing on a surface of the accessory.

18. A case and accessory system for a portable electronic device, said system comprising:
- a device case including a backing with a plurality of slugs or magnets embedded therein; and
- an accessory including a surface with a plurality of slugs or magnets embedded therein and disposed in a complimentary pattern to the plurality of slugs or magnets embedded in the case,
- wherein the patterns of the slugs and/or magnets are configured to allow the case to be semi-securely mounted to the accessory in a plurality of positions, at least two of the plurality of positions including arrangements in which the case completely overlays the accessory with different parts of the case, and
- wherein the accessory further comprises a sub-unit including at least one of a power unit, a control unit, and a communication module.

19. The system of claim 18, wherein the slugs or magnets are arranged in a pattern on each of the case and accessory with more magnets or slugs on the case than on the surface of the accessory.

20. The system of claim 18, wherein the accessory is substantially triangular and is configured to hold the case at an angle in one orientation, and to hold other items in a vertical cavity in another orientation.

* * * * *